United States Patent
Moon et al.

(10) Patent No.: US 11,217,130 B2
(45) Date of Patent: Jan. 4, 2022

(54) WIRING-DISCONNECTION DETECTING CIRCUIT AND ORGANIC LIGHT EMITTING DISPLAY DEVICE INCLUDING THE SAME

(71) Applicant: SAMSUNG DISPLAY CO., LTD., Yongin-si (KR)

(72) Inventors: Jiho Moon, Yongin-si (KR); Dae Youn Cho, Yongin-si (KR); Jongwoo Park, Yongin-si (KR); Ju Hee Lee, Yongin-si (KR); Youngtae Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 244 days.

(21) Appl. No.: 16/507,225

(22) Filed: Jul. 10, 2019

(65) Prior Publication Data
US 2020/0058241 A1    Feb. 20, 2020

(30) Foreign Application Priority Data
Aug. 20, 2018    (KR) .................... 10-2018-0096658

(51) Int. Cl.
G09G 3/00    (2006.01)
H01L 27/32    (2006.01)
G09G 3/3225    (2016.01)

(52) U.S. Cl.
CPC ........... *G09G 3/006* (2013.01); *G09G 3/3225* (2013.01); *H01L 27/3276* (2013.01); *G09G 2330/12* (2013.01)

(58) Field of Classification Search
CPC ..................... G09G 2330/12; G09G 3/006
See application file for complete search history.

(56) References Cited

U.S. PATENT DOCUMENTS

| 4,466,288 A * | 8/1984 | Grynberg ............... G01H 11/00 73/654 |
| 9,653,368 B2 | 5/2017 | Kwak et al. |
| 9,767,727 B2 | 9/2017 | Byun et al. |

(Continued)

FOREIGN PATENT DOCUMENTS

| KR | 10-0655778 B1 | 12/2006 |
| KR | 10-0773088 B1 | 10/2007 |
| KR | 10-2017-0115153 A | 10/2017 |

*Primary Examiner* — Hang Lin
(74) *Attorney, Agent, or Firm* — Kile Park Reed & Houtteman PLLC

(57) ABSTRACT

A wiring-disconnection detecting circuit includes a low-power voltage supply, a monitoring wiring, and a wiring-disconnection determiner. The low-power voltage supply supplies a low-power voltage to a low-power voltage wiring that extends along a periphery of a display panel in a normal operating mode of the display panel and supplies a test voltage to the low-power voltage wiring in a wiring-disconnection detecting mode of the display panel. The monitoring wiring includes a first end connected to one point of the low-power voltage wiring and a second end at which a feedback voltage corresponding to the test voltage is output in the wiring-disconnection detecting mode. The wiring-disconnection determiner receives the feedback voltage from the second end, measures an RC delay of the feedback voltage, and determines that the low-power voltage wiring is disconnected when the RC delay is larger than a predetermined reference value.

18 Claims, 11 Drawing Sheets

(56) References Cited

U.S. PATENT DOCUMENTS

| | | | |
|---|---|---|---|
| 2010/0264952 A1* | 10/2010 | Abe ..................... | H04N 5/775 |
| | | | 326/8 |
| 2015/0048835 A1* | 2/2015 | Lee ..................... | G01R 31/50 |
| | | | 324/414 |
| 2015/0204561 A1* | 7/2015 | Sadwick ................ | F24F 11/30 |
| | | | 236/1 C |
| 2017/0243540 A1* | 8/2017 | Liu ..................... | G09G 3/3258 |

* cited by examiner

WIRING-DISCONNECTION DETECTING CIRCUIT AND ORGANIC LIGHT EMITTING DISPLAY DEVICE INCLUDING THE SAME

CROSS-REFERENCE TO RELATED APPLICATION

Korean Patent Application No. 10-2018-0096658, filed on Aug. 20, 2018, in the Korean Intellectual Property Office, and entitled: "Wiring-Disconnection Detecting Circuit and Organic Light Emitting Display Device Including the Same," is incorporated by reference herein in its entirety.

BACKGROUND

1. Field

Embodiments relate to a wiring-disconnection detecting circuit and an organic light emitting display device including the same.

2. Description of the Related Art

When a display device has a structure in which a display panel driving circuit is placed behind a display panel, wiring defects may result in wiring becoming disconnected.

SUMMARY

Embodiments are directed to a wiring-disconnection detecting circuit, including a low-power voltage supply to supply a low-power voltage to a low-power voltage wiring that extends along a periphery of a display panel in a normal operating mode of the display panel and to supply a test voltage to the low-power voltage wiring in a wiring-disconnection detecting mode of the display panel, a monitoring wiring including a first end that is connected to one point of the low-power voltage wiring and a second end at which a feedback voltage corresponding to the test voltage is output in the wiring-disconnection detecting mode, and a wiring-disconnection determiner to receive the feedback voltage from the second end, to measure an RC delay of the feedback voltage, and to determine that the low-power voltage wiring is disconnected when the RC delay is larger than a predetermined reference value.

In example embodiments, the low-power voltage may be a constant voltage, and the test voltage may be a clock pulse voltage.

In example embodiments, the RC delay may be measured based on a rising time of the feedback voltage corresponding to the test voltage.

In example embodiments, the wiring-disconnection determiner may determine that the low-power voltage wiring is disconnected when the rising time of the feedback voltage is larger than a predetermined reference time.

In example embodiments, the low-power voltage wiring may include third and fourth ends that are connected to the low-power voltage supply, and the low-power voltage and the test voltage may be applied to the low-power voltage wiring through the third and fourth ends.

In example embodiments, the low-power voltage supply may be implemented in a display panel driving circuit that drives the display panel, and the low-power voltage wiring may extend via a pad region at which the display panel and the display panel driving circuit are connected.

In example embodiments, the low-power voltage supply may include a first voltage generating block connected to the third and fourth ends of the low-power voltage wiring and to generate the low-power voltage, a second voltage generating block to generate the test voltage, and a switch connected between the second voltage generating block and the third and fourth ends of the low-power voltage wiring and to be turned off in the normal operating mode and to be turned on in the wiring-disconnection detecting mode.

In example embodiments, the second voltage generating block may be a DC-AC inverter.

In example embodiments, the low-power voltage supply may include a first voltage generating block to generate the low-power voltage, a second voltage generating block to generate the test voltage, a first switch connected between the first voltage generating block and the third and fourth ends of the low-power voltage wiring and to be turned on in the normal operating mode and to be turned off in the wiring-disconnection detecting mode, and a second switch connected between the second voltage generating block and the third and fourth ends of the low-power voltage wiring and to be turned off in the normal operating mode and to be turned on in the wiring-disconnection detecting mode.

In example embodiments, the second voltage generating block may be a DC-AC inverter.

According to an aspect of example embodiments, an organic light emitting display device may include a display panel having a structure in which a low-power voltage is commonly applied to a plurality of pixels through a cathode layer that is connected to a low-power voltage wiring, which extends along a periphery of the display panel, by a bridge pattern when the low-power voltage is applied to the low-power voltage wiring, a display panel driving circuit to drive the display panel, and a wiring-disconnection detecting circuit to supply a test voltage to the low-power voltage wiring, to receive a feedback voltage corresponding to the test voltage through a monitoring wiring that is connected to one point of the low-power voltage wiring, and to detect whether the low-power voltage wiring is disconnected based on an RC delay of the feedback voltage in a wiring-disconnection detecting mode of the display panel.

In example embodiments, the wiring-disconnection detecting circuit may include a low-power voltage supply to supply the low-power voltage to the low-power voltage wiring in a normal operating mode of the display panel and to supply the test voltage to the low-power voltage wiring in the wiring-disconnection detecting mode, a monitoring wiring including a first end that is connected to the point of the low-power voltage wiring and a second end at which the feedback voltage is output in the wiring-disconnection detecting mode, and a wiring-disconnection determiner to receive the feedback voltage from the second end, to measure the RC delay, and to determine that the low-power voltage wiring is disconnected when the RC delay is larger than a predetermined reference value.

In example embodiments, the low-power voltage may be a constant voltage, and the test voltage may be a clock pulse voltage.

In example embodiments, the RC delay may be measured based on a rising time of the feedback voltage corresponding to the test voltage.

In example embodiments, the wiring-disconnection determiner may determine that the low-power voltage wiring is disconnected when the rising time of the feedback voltage is larger than a predetermined reference time.

In example embodiments, the low-power voltage wiring may include third and fourth ends that are connected to the low-power voltage supply, and the low-power voltage and the test voltage may be applied to the low-power voltage wiring through the third and fourth ends.

In example embodiments, the low-power voltage supply may be implemented in the display panel driving circuit, and the low-power voltage wiring may extend via a pad region at which the display panel and the display panel driving circuit are connected.

In example embodiments, the low-power voltage supply may include a first voltage generating block connected to the third and fourth ends of the low-power voltage wiring and to generate the low-power voltage, a second voltage generating block to generate the test voltage, and a switch connected between the second voltage generating block and the third and fourth ends of the low-power voltage wiring and to be turned off in the normal operating mode and to be turned on in the wiring-disconnection detecting mode.

In example embodiments, the low-power voltage supply may include a first voltage generating block to generate the low-power voltage, a second voltage generating block to generate the test voltage, a first switch connected between the first voltage generating block and the third and fourth ends of the low-power voltage wiring and to be turned on in the normal operating mode and to be turned off in the wiring-disconnection detecting mode, and a second switch connected between the second voltage generating block and the third and fourth ends of the low-power voltage wiring and to be turned off in the normal operating mode and to be turned on in the wiring-disconnection detecting mode.

In example embodiments, the wiring-disconnection determiner may be implemented in the display panel driving circuit.

BRIEF DESCRIPTION OF THE DRAWINGS

Features will become apparent to those of skill in the art by describing in detail example embodiments with reference to the attached drawings in which.

DETAILED DESCRIPTION

Figure 1A:
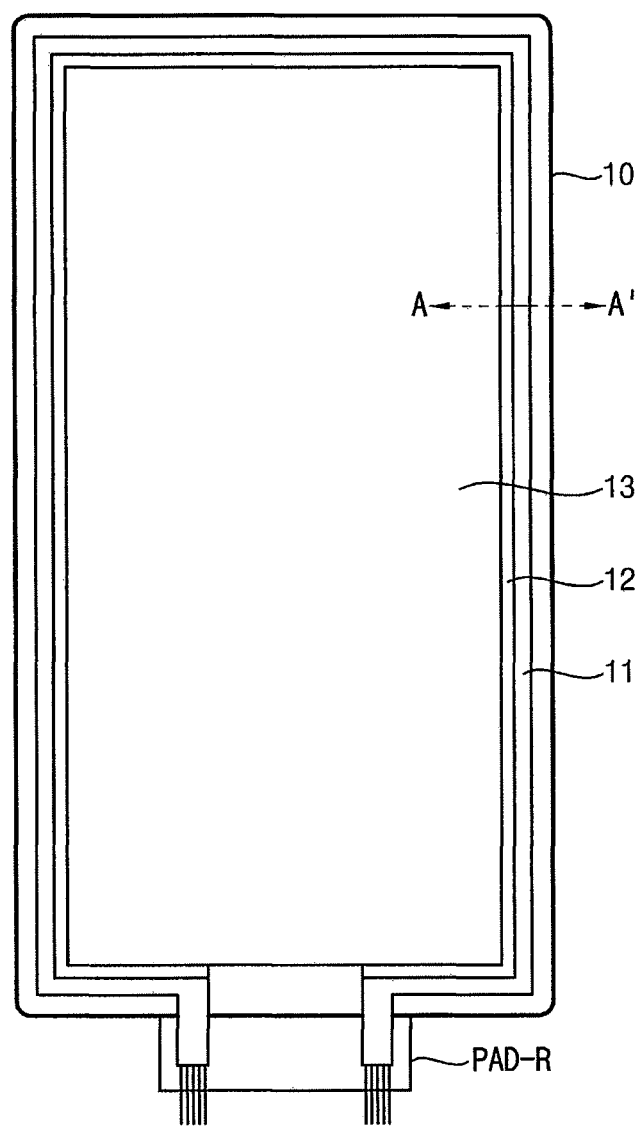
FIGS. 1A to 1C illustrate diagrams of a structure in which a low-power voltage is applied to a display panel of an organic light emitting display device.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

Figure 1B:
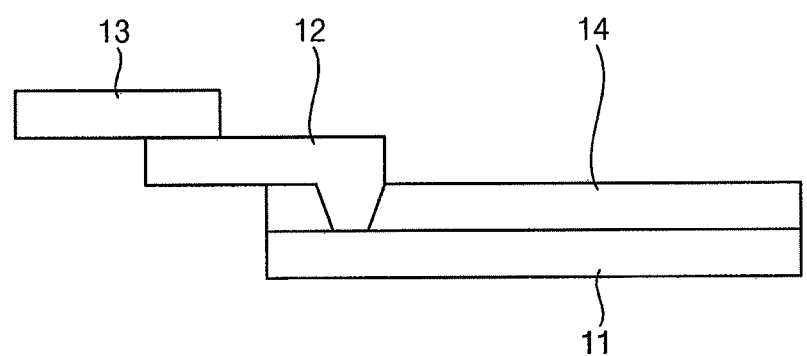
Figure 1C:
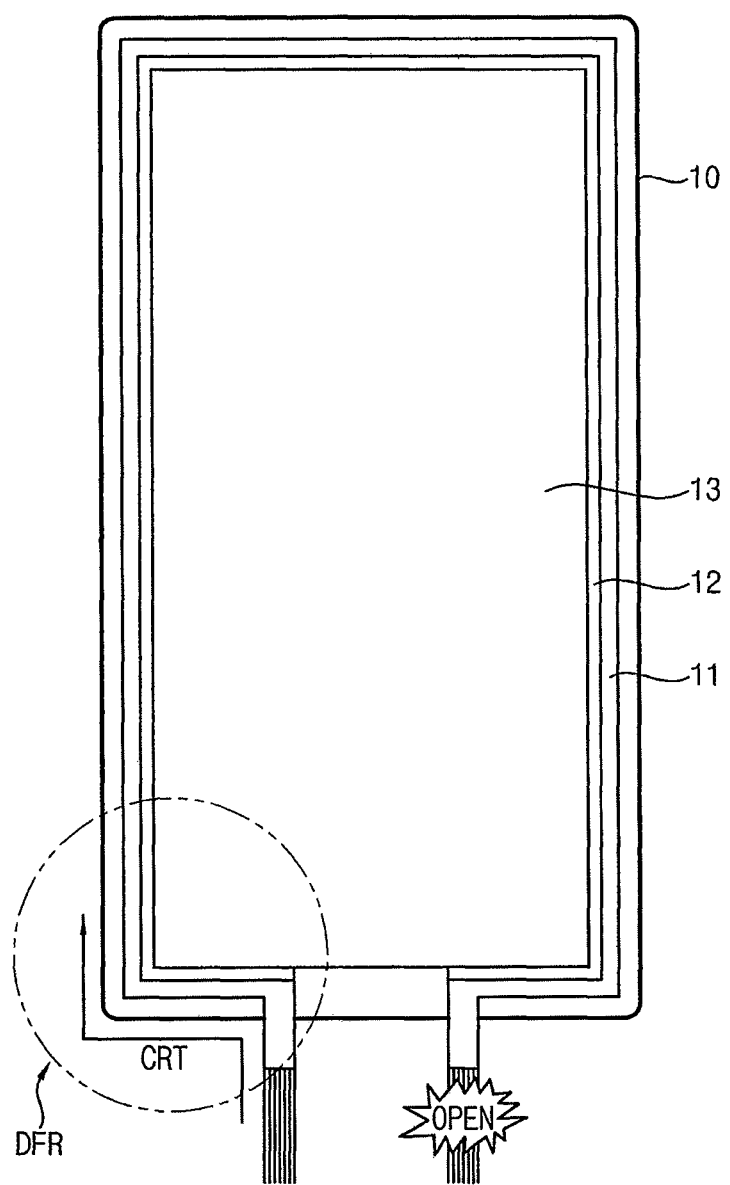

FIGS. 1A to 1C illustrate diagrams of a structure in which a low-power voltage is applied to a display panel of an organic light emitting display device. FIG. 1B is a cross-sectional diagram taken along the line A-A' in FIG. 1A.

Referring to FIG. 1A, a display panel 10 may be part of an organic light emitting display device, and may include a plurality of pixels each including an organic light emitting diode. Referring to FIG. 1B, the pixels may commonly receive a low-power voltage ELVSS through a cathode layer 13 corresponding to a cathode of the organic light emitting diode. For example, as illustrated in FIGS. 1A and 1B, the display panel 10 may have a structure in which the low-power voltage ELVSS is commonly applied to the pixels through the cathode layer 13, which is connected to a low-power voltage wiring 11 by a bridge pattern 12, when the low-power voltage ELVSS is applied to the low-power voltage wiring 11, which extends along a periphery of the display panel 10. As illustrated in FIG. 1B, in the display panel 10, an insulation layer 14 may be formed on the low-power voltage wiring 11, the low-power voltage wiring 11 may be contacted with the bridge pattern 12 via a contact hole formed in the insulation layer 14, and the bridge pattern 12 may be contacted with the cathode layer 13. Thus, when the low-power voltage ELVSS is applied to the low-power voltage wiring 11, the low-power voltage ELVSS may be transferred to the cathode layer 13 through the bridge pattern 12.

As illustrated in FIGS. 1A and 1C, the low-power voltage wiring 11 may extend via a pad region PAD-R, at which the display panel 10 and a display panel driving circuit that drives the display panel 10 are connected. The pad region PAD-R may be bent to place the display panel driving circuit behind the display panel 10. As the pad region PAD-R is bent, the low-power voltage wiring 11 may be disconnected (as indicated by OPEN) at the pad region PAD-R. In this case, as illustrated in FIG. 1C, even when one path (or end) of the low-power voltage wiring 11 is disconnected (as indicated by OPEN), the low-power voltage ELVSS may be transferred through another path (or end) of the low-power voltage wiring 11 (as indicated by CRT), such that the display panel 10 may operate normally. However, when a current flows only through the other path of the low-power voltage wiring 11 (as indicated by CRT), the pixels located in a region near another path of the low-power voltage wiring 11 (as indicated by DFR) may be deteriorated rapidly over time by overheating due to the current flowing through the other path CRT of the low-power voltage wiring 11. Thus, when one path of the low-power voltage wiring 11 is disconnected (as indicated by OPEN), display quality of the display panel 10 may be degraded over time even though the display panel 10 may initially appear to operate normally. Further, it may be difficult to visually detect whether the low-power voltage wiring 11 is disconnected.

Figure 2:
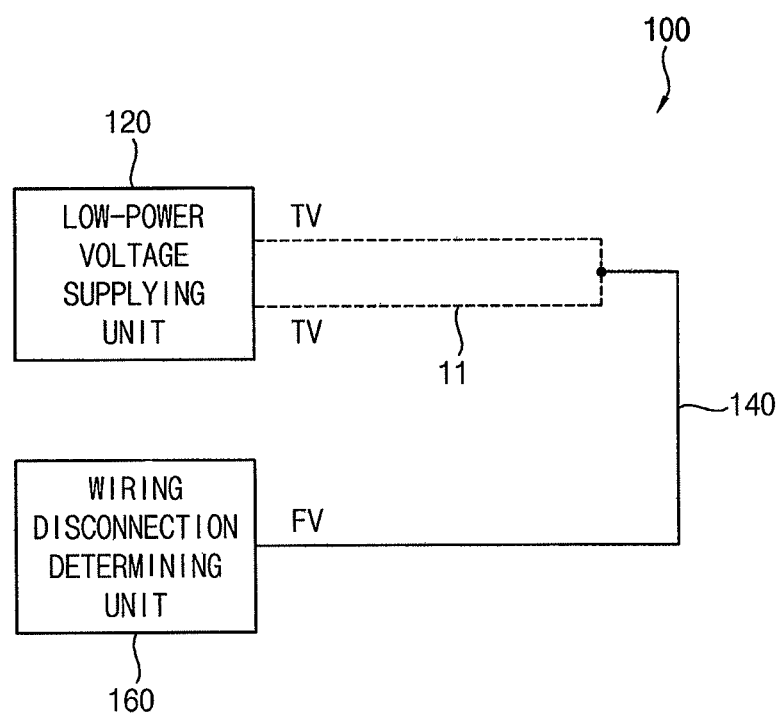
FIG. 2 illustrates a block diagram of a wiring-disconnection detecting circuit according to an example embodiment.
Figure 3:
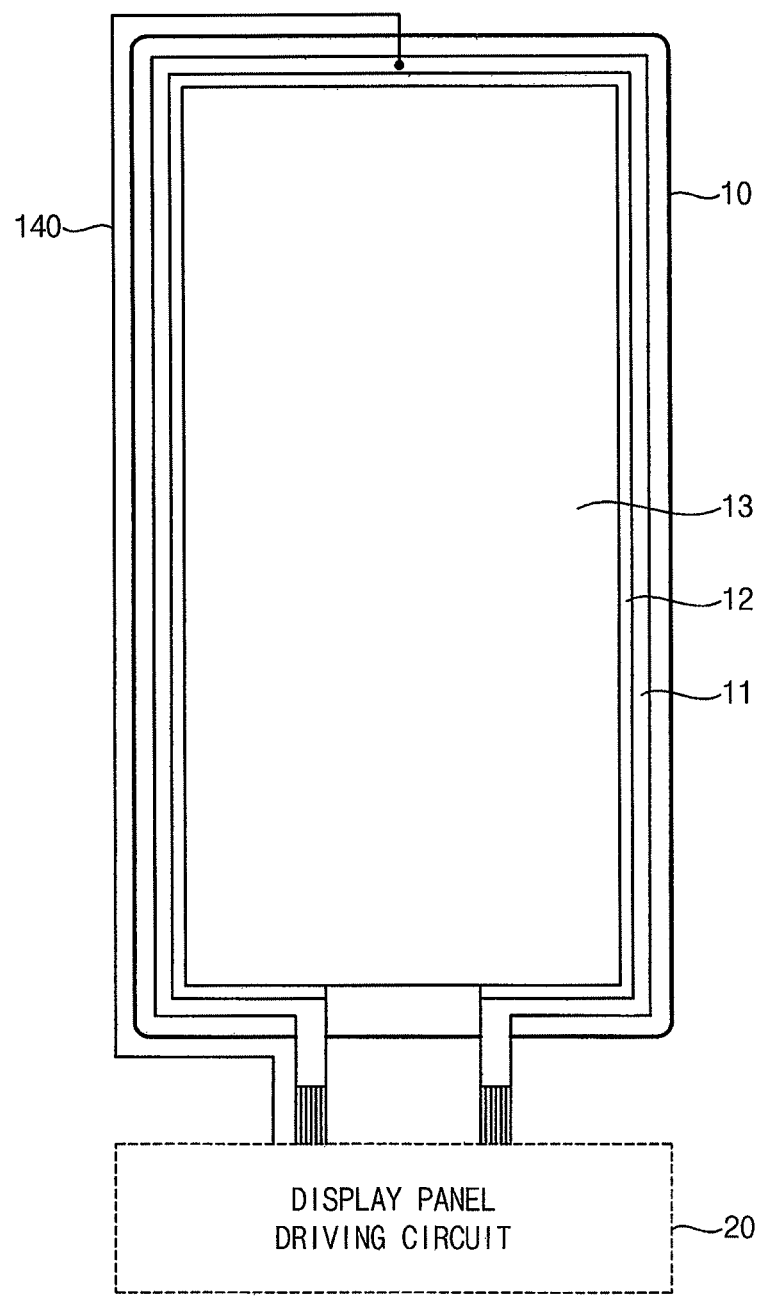
FIG. 3 illustrates a diagram of an example in which a monitoring wiring included in the wiring-disconnection detecting circuit of FIG. 2 is connected to a low-power voltage wiring that extends along a periphery of a display panel.
Figure 4A:
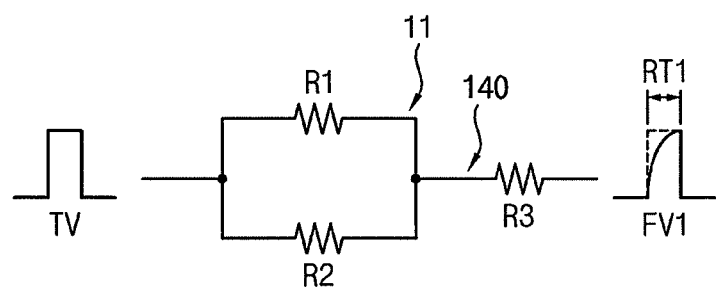
FIGS. 4A and 4B illustrate diagrams describing operation of the wiring-disconnection detecting circuit of FIG. 2.
Figure 4B:
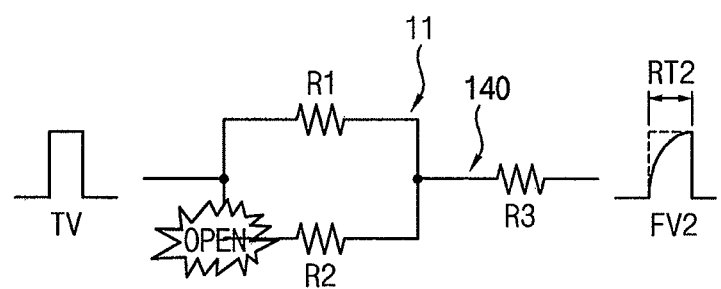

FIG. 2 is a block diagram illustrating a wiring-disconnection detecting circuit according to an example embodiment, FIG. 3 is a diagram illustrating an example in which a monitoring wiring included in the wiring-disconnection detecting circuit of FIG. 2 is connected to a low-power voltage wiring that extends along a periphery of a display panel, and FIGS. 4A and 4B are diagrams for describing how the wiring-disconnection detecting circuit of FIG. 2 detects whether a low-power voltage wiring, which extends along a periphery of a display panel, is disconnected.

Referring to FIGS. 2 to 4B, the wiring-disconnection detecting circuit 100 may include a low-power voltage supply (or a low-power voltage supplying circuit) 120, a monitoring wiring 140, and a wiring-disconnection determiner (or wiring-disconnection determining circuit) 160. The low-power voltage supply 120 may be connected to both ends (hereinafter, referred to as third and fourth ends) of a low-power voltage wiring 11 (e.g., a wiring through which a low-power voltage ELVSS is transferred) that extends along a periphery of a display panel 10, and the monitoring wiring 140 may be connected to one point of the low-power voltage wiring 11.

The low-power voltage supply 120 may supply the low-power voltage ELVSS to the low-power voltage wiring 11 in a normal operating mode of the display panel 10. The low-power voltage supply 120 may concurrently apply the low-power voltage ELVSS to both ends of the low-power voltage wiring 11. Thus, the low-power voltage ELVSS may be commonly applied to the pixels included in the display panel 10 via the low-power voltage wiring 11 (e.g., the low-power voltage wiring 11 may be formed to have a multilayered structure of Ti—Al—Ti), the bridge pattern 12 (e.g., the bridge pattern 12 may be formed to have a multilayered structure of ITO-Ag-ITO), and the cathode layer 13 (e.g., the cathode layer 13 may be formed to have a multilayered structure of Mg—Ag). Thus, in the normal operating mode of the display panel 10, the display panel 10 may perform a displaying operation based on the low-power voltage ELVSS, a high-power voltage ELVDD, and a data signal (e.g., a data voltage) applied to each pixel. In an example embodiment, the low-power voltage ELVSS may be a direct-current (DC) voltage (e.g., a constant voltage). The low-power voltage supply 120 may supply a test voltage TV to the low-power voltage wiring 11 in a wiring-disconnection detecting mode of the display panel 10. The low-power voltage supply 120 may concurrently apply the test voltage TV to both ends of the low-power voltage wiring 11. In an example embodiment, the test voltage TV may be an alternating-current (AC) voltage (e.g., a clock pulse voltage). In an example embodiment, the low-power voltage supply 120 may be implemented in a display panel driving circuit 20 that drives the display panel 10.

The monitoring wiring 140 may include a first end that is connected to one point of the low-power voltage wiring 11 and a second end at which a feedback voltage FV corresponding to the test voltage TV is output in the wiring-disconnection detecting mode of the display panel 10. Thus, the monitoring wiring 140 may be located between one point of the low-power voltage wiring 11 and a wiring-disconnection determiner 160. For example, as illustrated in FIG. 3, the point at which the monitoring wiring 140 is connected to the low-power voltage wiring 11 may be a point that is apart from both ends (i.e., third and fourth ends) of the low-power voltage wiring 11 by the same distance. In this case, a resistance R1 between the point and the third end of the low-power voltage wiring 11 may be equal to a resistance R2 between the point and the fourth end of the low-power voltage wiring 11. In addition, as illustrated in FIG. 3, the monitoring wiring 140 may extend along a periphery of the display panel 10. The low-power voltage wiring 11 and the monitoring wiring 140 may have resistances R1, R2, and R3, and thus, as compared to the test voltage TV, an RC delay may exist in the feedback voltage FV that is generated after the test voltage TV applied to the low-power voltage wiring 11 in the wiring-disconnection detecting mode of the display panel 10 passes through the low-power voltage wiring 11 and the monitoring wiring 140.

The wiring-disconnection determiner 160 may receive the feedback voltage FV from the second end of the monitoring wiring 140 (i.e., the wiring-disconnection determiner 160 is connected to the second end of the monitoring wiring 140), may measure the RC delay of the feedback voltage FV, may determine that the low-power voltage wiring 11 is disconnected when the RC delay of the feedback voltage FV is larger than a reference value, and may determine that the low-power voltage wiring 11 is not disconnected when the RC delay of the feedback voltage FV is not larger than the reference value. In an example embodiment, the RC delay of the feedback voltage FV may be measured based on a rising time of the feedback voltage FV corresponding to the test voltage TV. Thus, because the rising time of the feedback voltage FV is relatively long when the RC delay of the feedback voltage FV is relatively large and because the rising time of the feedback voltage FV is relatively short when the RC delay of the feedback voltage FV is relatively small, the RC delay of the feedback voltage FV may be measured based on the rising time of the feedback voltage FV corresponding to the test voltage TV. In this case, when the rising time of the feedback voltage FV corresponding to the test voltage TV is longer than a reference time, the wiring-disconnection determiner 160 may determine that the low-power voltage wiring 11 extending along the periphery of the display panel 10 is disconnected. On the other hand, when the rising time of the feedback voltage FV corresponding to the test voltage TV is not longer than the reference time, the wiring-disconnection determiner 160 may determine that the low-power voltage wiring 11 extending along the periphery of the display panel 10 is not disconnected. In an example embodiment, as illustrated in FIG. 3, the wiring-disconnection determiner 160 may be implemented in the display panel driving circuit 20.

In the case illustrated in FIG. 4A, the low-power voltage wiring 11 is not disconnected. In this case, when the test voltage TV is supplied to the third and fourth ends of the low-power voltage wiring 11, the resistance R1 (between the third end of the low-power voltage wiring 11 and the point to which the monitoring wiring 140 is connected) may be connected to the resistance R2 (between the fourth end of the low-power voltage wiring 11 and the point to which the monitoring wiring 140 is connected) in parallel. Thus, a total resistance of the low-power voltage wiring 11 may be calculated as (R1×R2)/(R1+R2). In addition, the total resistance (R1×R2)/(R1+R2) of the low-power voltage wiring 11 may be connected to the resistance R3 of the monitoring wiring 140 in series. Thus, a total wiring resistance of the low-power voltage wiring 11 and the monitoring wiring 140 may be calculated as R3+((R1×R2)/(R1+R2)). Thus, the RC delay of the feedback voltage FV when the low-power voltage wiring 11 is not disconnected may be smaller than the RC delay of the feedback voltage FV when the low-power voltage wiring 11 is disconnected (as indicated by FV1). As described above, the wiring-disconnection determiner 160 may determine that the low-power voltage wiring 11 that extends along the periphery of the display panel 10 is disconnected when the rising time of the feedback voltage FV corresponding to the test voltage TV is longer than the reference time, and may determine that the low-power voltage wiring 11 that extends along the periphery of the display panel 10 is not disconnected when the rising time of the feedback voltage FV corresponding to the test voltage TV is not longer than the reference time. Thus, the wiring-disconnection determiner 160 may set the reference time to be longer than the rising time RT1 of the feedback voltage FV1 corresponding to the test voltage TV by a specific time. Thus, because the rising time RT1 of the feedback voltage FV1 is shorter than the reference time, the rising time RT1 of the feedback voltage FV1 may indicate that the low-power voltage wiring 11 is not disconnected.

In another case, illustrated in FIG. 4B, the low-power voltage wiring 11 may be disconnected (as indicated by OPEN). In this case, when the test voltage TV is supplied to the third and fourth ends of the low-power voltage wiring 11, a total resistance of the low-power voltage wiring 11 may be the resistance R1 between the third end of the low-power voltage wiring 11 and the point to which the monitoring wiring 140 is connected. In addition, the total resistance R1 of the low-power voltage wiring 11 may be connected to the resistance R3 of the monitoring wiring 140 in series. Thus, a total wiring resistance of the low-power voltage wiring 11 and the monitoring wiring 140 may be calculated as R3+R1. Here, because the resistance (R3+R1) is greater than the resistance R3+((R1×R2)/(R1+R2)), the RC delay of the feedback voltage FV when the low-power voltage wiring 11 is disconnected may be larger than the RC delay of the feedback voltage FV when the low-power voltage wiring 11 is not disconnected (as indicated by FV2). As described above, the wiring-disconnection determiner 160 may determine that the low-power voltage wiring 11 that extends along the periphery of the display panel 10 is disconnected when the rising time of the feedback voltage FV corresponding to the test voltage TV is longer than the reference time, and may determine that the low-power voltage wiring 11 that extends along the periphery of the display panel 10 is not disconnected when the rising time of the feedback voltage FV corresponding to the test voltage TV is not longer than the reference time. Thus, the wiring-disconnection determiner 160 may set the reference time to be longer than the rising time RT1 of the feedback voltage FV1 corresponding to the test voltage TV by a specific time. Thus, when the rising time RT2 of the feedback voltage FV2 is longer than the reference time, the rising time RT2 of the feedback voltage FV2 may indicate that the low-power voltage wiring 11 is disconnected.

The wiring-disconnection detecting circuit 100 may accurately detect whether the low-power voltage wiring 11, which extends along the periphery of the display panel 10, is disconnected in a simple way by supplying the test voltage TV to the low-power voltage wiring 11, by receiving the feedback voltage FV corresponding to the test voltage TV through the monitoring wiring 140 that is connected to one point of the low-power voltage wiring 11, by measuring the RC delay of the feedback voltage FV, and by determining that the low-power voltage wiring 11 is disconnected when the RC delay of the feedback voltage FV is larger than the reference value in the wiring-disconnection detecting mode of the display panel 10. Thus, an organic light emitting display device including the wiring-disconnection detecting circuit 100 may early detect defects (e.g., degradation in display quality, etc.) due to wiring-disconnection of the low-power voltage wiring 11 that extends along the periphery of the display panel 10.

Figure 5:
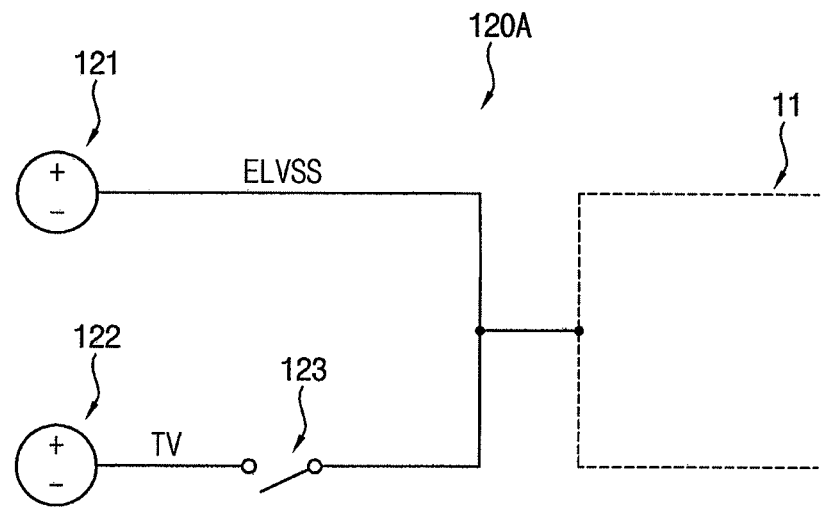
FIG. 5 illustrates a circuit diagram of an example of a low-power voltage supply included in the wiring-disconnection detecting circuit of FIG. 2.

FIG. 5 is a circuit diagram illustrating an example of a low-power voltage supply included in the wiring-disconnection detecting circuit of FIG. 2.

Referring to FIG. 5, the low-power voltage supply 120A may include a first voltage generating block 121, a second voltage generating block 122, and a switch 123. For example, the first voltage generating block 121 may be connected to both ends (i.e., third and fourth ends) of the low-power voltage wiring 11 that extends along the periphery of the display panel 10. The first voltage generating block 121 may generate the low-power voltage ELVSS. The low-power voltage ELVSS may be a DC voltage (e.g., a constant voltage), and the first voltage generating block 121 may be a DC voltage source. The second voltage generating block 122 may generate the test voltage TV. The test voltage TV may be an AC voltage (e.g., a clock pulse voltage), and the second voltage generating block 122 may be an AC voltage source. In an example embodiment, the second voltage generating block 122 may be a DC-AC inverter. The switch 123 may be connected between the second voltage generating block 122 and the third and fourth ends of the low-power voltage wiring 11. The switch 123 may be turned off in the normal operating mode of the display panel 10 and may be turned on in the wiring-disconnection detecting mode of the display panel 10. Thus, because the switch 123 is turned off in the normal operating mode of the display panel 10, only the low-power voltage ELVSS that is generated by the first voltage generating block 121 may be applied to the low-power voltage wiring 11. On the other hand, because the switch 123 is turned on in the wiring-disconnection detecting mode of the display panel 10, both the low-power voltage ELVSS that is generated by the first voltage generating block 121 and the test voltage TV that is generated by the second voltage generating block 122 may be applied to the low-power voltage wiring 11. As described above, the low-power voltage supply 120A may supply the low-power voltage ELVSS to the low-power voltage wiring 11 in the normal operating mode of the display panel 10, and may supply a test voltage (e.g., both the low-power voltage ELVSS and the test voltage TV) to the low-power voltage wiring 11 in the wiring-disconnection detecting mode of the display panel 10.

Figure 6:
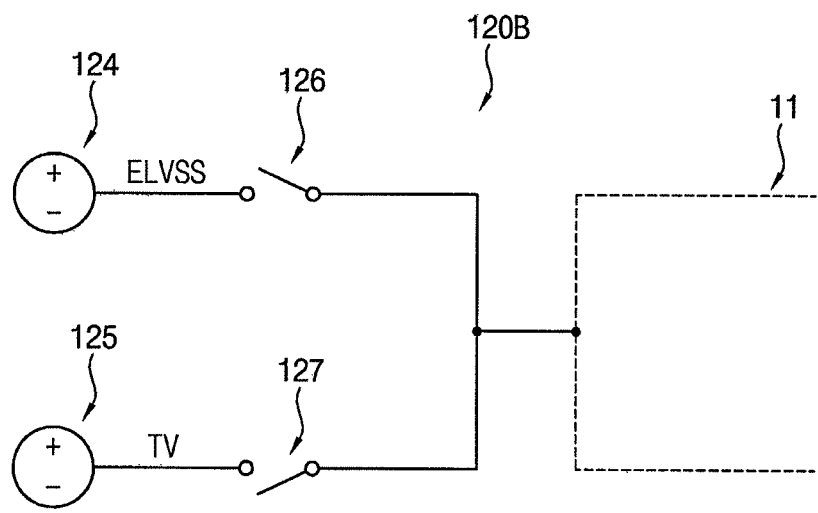
FIG. 6 illustrates a circuit diagram of another example of a low-power voltage supply included in the wiring-disconnection detecting circuit of FIG. 2.

FIG. 6 is a circuit diagram illustrating another example of a low-power voltage supply included in the wiring-disconnection detecting circuit of FIG. 2.

Referring to FIG. 6, the low-power voltage supply 120B may include a first voltage generating block 124, a second voltage generating block 125, a first switch 126, and a second switch 127. For example, the first voltage generating block 124 may generate the low-power voltage ELVSS. The low-power voltage ELVSS may be a DC voltage (e.g., a constant voltage), and the first voltage generating block 124 may be a DC voltage source. The second voltage generating block 125 may generate the test voltage TV. The test voltage TV may be an AC voltage (e.g., a clock pulse voltage), and the second voltage generating block 125 may be an AC voltage source. In an example embodiment, the second voltage generating block 125 may be a DC-AC inverter. The first switch 126 may be connected between the first voltage generating block 124 and the third and fourth ends of the low-power voltage wiring 11. The first switch 126 may be turned on in the normal operating mode of the display panel 10, and may be turned off in the wiring-disconnection detecting mode of the display panel 10. The second switch 127 may be connected between the second voltage generating block 125 and the third and fourth ends of the low-power voltage wiring 11. The second switch 127 may be turned off in the normal operating mode of the display panel 10, and may be turned on in the wiring-disconnection detecting mode of the display panel 10. Thus, because the first switch 126 is turned on and the second switch 127 is turned off in the normal operating mode of the display panel 10, only the low-power voltage ELVSS that is generated by the first voltage generating block 124 may be applied to the low-power voltage wiring 11. On the other hand, because the first switch 126 is turned off and the second switch 127 is turned on in the wiring-disconnection detecting mode of the display panel 10, only the test voltage TV that is generated by the second voltage generating block 125 may be applied to the low-power voltage wiring 11. As described above, the low-power voltage supply 120B may supply the low-power voltage ELVSS to the low-power voltage wiring 11 in the normal operating mode of the display panel 10, and may supply the test voltage TV to the low-power voltage wiring 11 in the wiring-disconnection detecting mode of the display panel 10.

Figure 7:
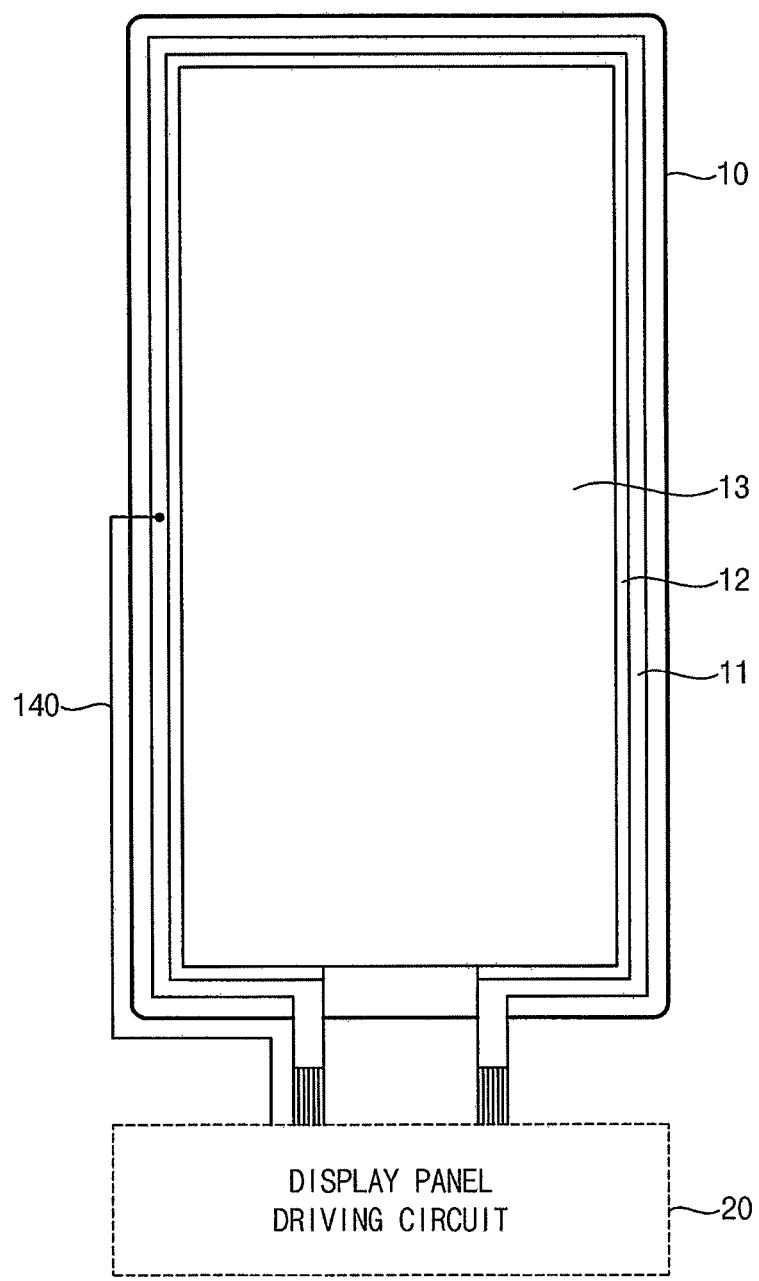
FIG. 7 illustrates a diagram of another example in which a monitoring wiring included in the wiring-disconnection detecting circuit of FIG. 2 is connected to a low-power voltage wiring that extends along a periphery of a display panel.
Figure 8:
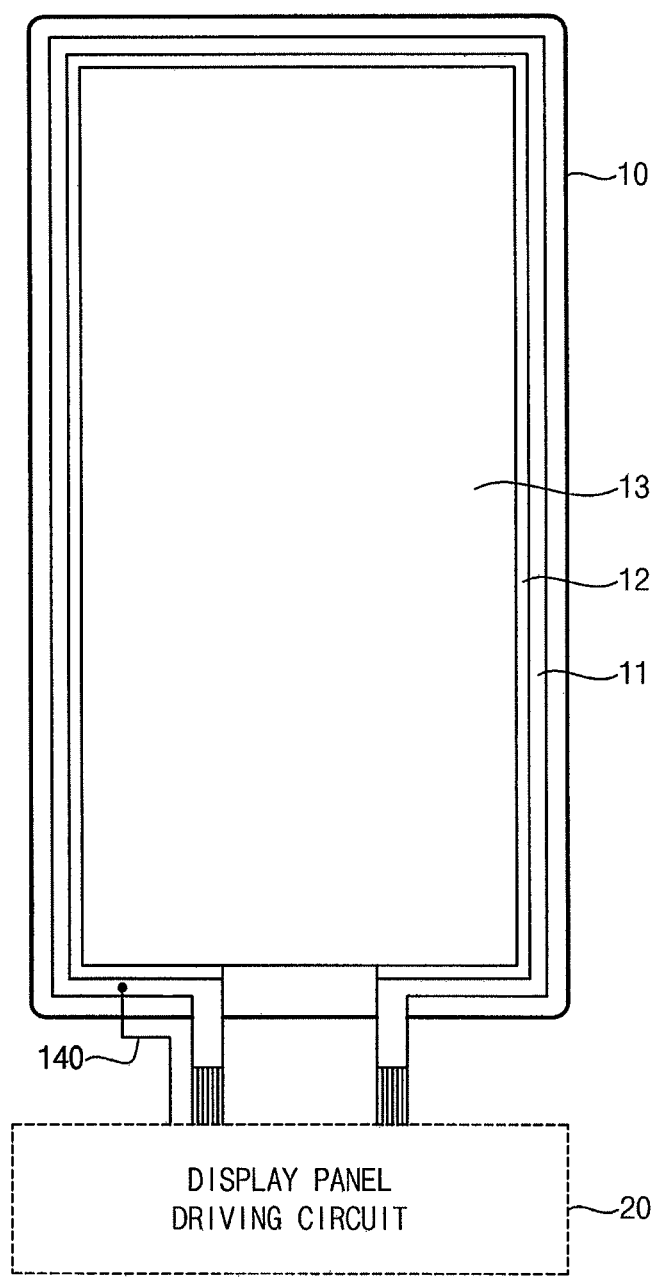
FIG. 8 illustrates a diagram of another example in which a monitoring wiring included in the wiring-disconnection detecting circuit of FIG. 2 is connected to a low-power voltage wiring that extends along a periphery of a display panel.

FIG. 7 is a diagram illustrating another example in which a monitoring wiring included in the wiring-disconnection detecting circuit of FIG. 2 is connected to a low-power voltage wiring that extends along a periphery of a display panel, and FIG. 8 is a diagram illustrating still another example in which a monitoring wiring included in the wiring-disconnection detecting circuit of FIG. 2 is connected to a low-power voltage wiring that extends along a periphery of a display panel.

Referring to FIGS. 7 and 8, the monitoring wiring 140 may include a first end that is connected to one point of the low-power voltage wiring 11 and a second end at which the feedback voltage FV corresponding to the test voltage TV is output in the wiring-disconnection detecting mode of the display panel 10. Thus, the monitoring wiring 140 may be located between one point of the low-power voltage wiring 11 and the wiring-disconnection determiner 160 located in the display panel driving circuit 20. For example, as illustrated in FIGS. 7 and 8, the point at which the monitoring wiring 140 is connected to the low-power voltage wiring 11 may be a connection point that is apart from both ends of the low-power voltage wiring 11 by different distances. For example, when an average cross-sectional area between the connection point and the third end (e.g., a left end) of the low-power voltage wiring 11 is smaller than an average cross-sectional area between the connection point and the fourth end (e.g., a right end) of the low-power voltage wiring 11, a length between the connection point and the third end of the low-power voltage wiring 11 may be shorter than a length between the connection point and the fourth end of the low-power voltage wiring 11, and thus a resistance between the connection point and the third end of the low-power voltage wiring 11 may still be equal to a resistance between the connection point and the fourth end of the low-power voltage wiring 11. As described above, the point at which the monitoring wiring 140 is connected to the low-power voltage wiring 11 may be determined by considering a resistance distribution of the low-power voltage wiring 11. In another implementation, the point at which the monitoring wiring 140 is connected to the low-power voltage wiring 11 may be determined by considering a location of the low-power voltage wiring 11 that is vulnerable to disconnection.

Figure 9:
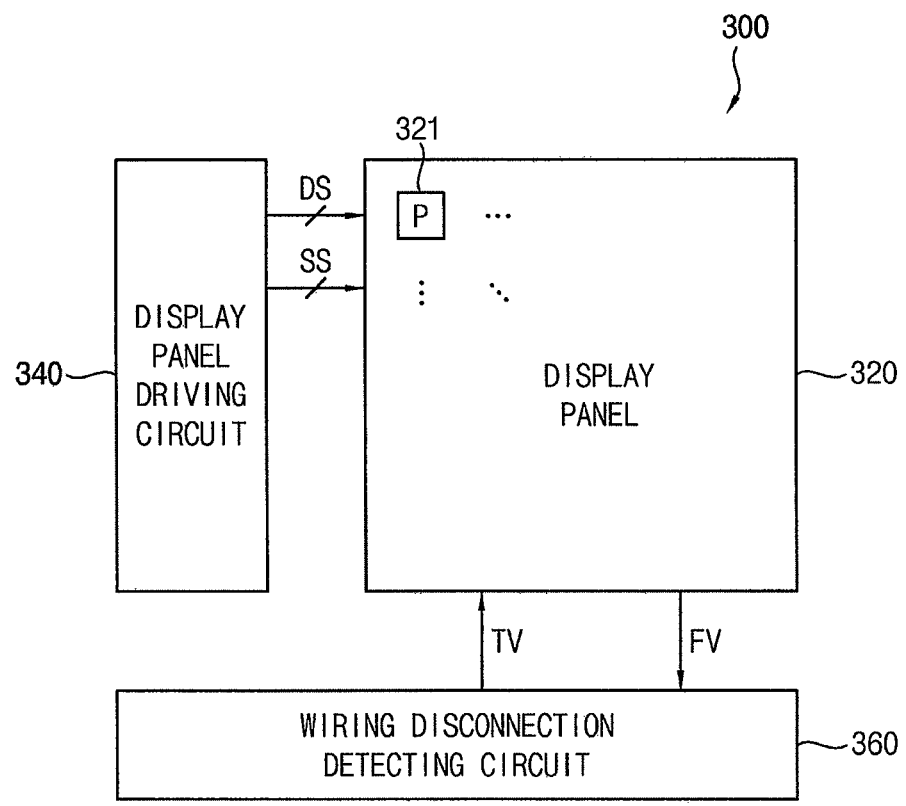
FIG. 9 illustrates a block diagram of an organic light emitting display device according to an example embodiment.

FIG. 9 is a block diagram illustrating an organic light emitting display device according to an example embodiment.

Referring to FIG. 9, the organic light emitting display device 300 may include a display panel 320, a display panel driving circuit 340, and a wiring-disconnection detecting circuit 360. Although it is illustrated in FIG. 9, for convenience of description, that the wiring-disconnection detecting circuit 360 is separated from the display panel 320 and the display panel driving circuit 340, respective components of the wiring-disconnection detecting circuit 360 may be located in the display panel 320 and/or the display panel driving circuit 340.

The display panel 320 may include a plurality of pixels 321. The pixels 321 may be arranged in various forms (e.g., a matrix form, etc.) in the display panel 320. The display panel 320 may have a structure in which a low-power voltage ELVSS is commonly applied to the pixels 321 through a cathode layer that is connected to a low-power voltage wiring (which extends along a periphery of the display panel 320) by a bridge pattern when the low-power voltage ELVSS is applied to the low-power voltage wiring. The display panel driving circuit 340 may drive the display panel 320. In an example embodiment, the display panel driving circuit 340 may include a scan driver, a data driver, a power management integrated circuit, and a timing controller. The display panel 320 may be connected to the scan driver via a plurality of scan-lines. The display panel 320 may be connected to the data driver via a plurality of data-lines. The scan driver may provide a scan signal SS to the pixels 321 included in the display panel 320 via the scan-lines. The data driver may provide a data signal DS to the pixels 321 included in the display panel 320 via the data-lines. The power management integrated circuit may provide various voltages required for driving the display panel 320. The timing controller may generate and provide a plurality of control signals to the scan driver and the data driver to control the scan driver and the data driver. In an example embodiment, the timing controller may perform a given processing (e.g., a deterioration compensation processing, etc.) on the data signal DS input from an external component. In an example embodiment, the display panel driving circuit 340 may further include an emission control driver. In this case, the emission control driver may be connected to the display panel 320 via a plurality of emission control-lines. The emission control driver may provide an emission control signal to the pixels 321 included in the display panel 320 via the emission control-lines.

The wiring-disconnection detecting circuit 360 may supply a test voltage TV to the low-power voltage wiring, may receive a feedback voltage FV corresponding to the test voltage TV through the monitoring wiring that is connected to one point of the low-power voltage wiring, and may detect whether the low-power voltage wiring is disconnected based on an RC delay of the feedback voltage FV in a wiring-disconnection detecting mode of the display panel 320. The low-power voltage ELVSS may be a constant voltage, and the test voltage TV may be a clock pulse voltage. The wiring-disconnection detecting circuit 360 may apply the low-power voltage ELVSS to the low-power voltage wiring that extends along the periphery of the display panel 320 in a normal operating mode of the display panel 320. In an example embodiment, the wiring-disconnection detecting circuit 360 may include the low-power voltage supply, the monitoring wiring, and the wiring-disconnection determiner. The low-power voltage supply may supply the low-power voltage ELVSS to the low-power voltage wiring in the normal operating mode of the display panel 320 and may supply the test voltage TV to the low-power voltage wiring in the wiring-disconnection detecting mode of the display panel 320. The monitoring wiring may include a first end that is connected to one point of the low-power voltage wiring and a second end at which the feedback voltage FV corresponding to the test voltage TV is output in the wiring-disconnection detecting mode of the display panel 320. The wiring-disconnection determiner may receive the feedback voltage FV from the second end of the monitoring wiring (i.e., may be connected to the second end of the monitoring wiring), may measure the RC delay of the feedback voltage FV, and may determine that the low-power voltage wiring is disconnected when the RC delay of the feedback voltage FV is larger than a predetermined reference value. As described above, the RC delay of the feedback voltage FV may be measured based on a rising time of the feedback voltage FV corresponding to the test voltage TV. In addition, it may be determined that the low-power voltage wiring is disconnected when the rising time of the feedback voltage FV is larger than the reference time.

In an example embodiment, the low-power voltage supply may be implemented in the display panel driving circuit 340. The monitoring wiring may extend along the periphery of the display panel 320. The wiring-disconnection determiner may be implemented in the display panel driving circuit 340. The low-power voltage wiring and the monitoring wiring, which extend along the periphery of the display panel 320, may extend via a pad region at which the display panel 320 and the display panel driving circuit 340 are connected. Thus, the second end of the monitoring wiring may be connected to the wiring-disconnection determiner that is implemented in the display panel driving circuit 340, and both ends (i.e., the third and fourth ends) of the low-power voltage wiring may be connected to the low-power voltage supply that is implemented in the display panel driving circuit 340. Thus, the low-power voltage ELVSS and the test voltage TV may be applied to the low-power voltage wiring through both ends of the low-power voltage wiring, and the feedback voltage FV corresponding to the test voltage TV may be applied to the wiring-disconnection determiner through the second end of the monitoring wiring. In an example embodiment, the low-power voltage supply may include a first voltage generating block, a second voltage generating block, and a switch. The first voltage generating block may be connected to the third and fourth ends of the low-power voltage wiring. The first voltage generating block may generate the low-power voltage ELVSS. The second voltage generating block may generate the test voltage TV. The switch may be connected between the second voltage generating block and the third and fourth ends of the low-power voltage wiring. The switch may be turned off in the normal operating mode of the display panel 320, and may be turned on in the wiring-disconnection detecting mode of the display panel 320. In another example embodiment, the low-power voltage supply may include a first voltage generating block, a second voltage generating block, a first switch, and a second switch. The first voltage generating block may generate the low-power voltage ELVSS. The second voltage generating block may generate the test voltage TV. The first switch may be connected between the first voltage generating block and the third and fourth ends of the low-power voltage wiring. The first switch may be turned on in the normal operating mode of the display panel 320, and may be turned off in the wiring-disconnection detecting mode of the display panel 320. The second switch may be connected between the second voltage generating block and the third and fourth ends of the low-power voltage wiring. The second switch may be turned off in the normal operating mode of the display panel 320, and may be turned on in the wiring-disconnection detecting mode of the display panel 320. These may be the same as described above with reference to FIGS. 5 and 6.

The organic light emitting display device 300 may provide an early detection of defects (e.g., degradation in display quality, etc.) due to wiring-disconnection of the low-power voltage wiring that extends along the periphery of the display panel 320 by including the wiring-disconnection detecting circuit 360 that can accurately detect whether the low-power voltage wiring is disconnected in a simply way. For example, when the organic light emitting display device 300 has a structure in which the display panel driving circuit 340 is placed behind the display panel 320, it may be accurately determined whether the low-power voltage wiring is disconnected, where the wiring-disconnection of the low-power voltage wiring may be caused, for example, when the pad region at which the display panel 320 and the display panel driving circuit 340 are connected is bent in a manufacturing process of the organic light emitting display device 300. Thus, for example, the organic light emitting display device 300 having the defects due to the wiring-disconnection of the low-power voltage wiring may be prevented from being shipped.

Figure 10:
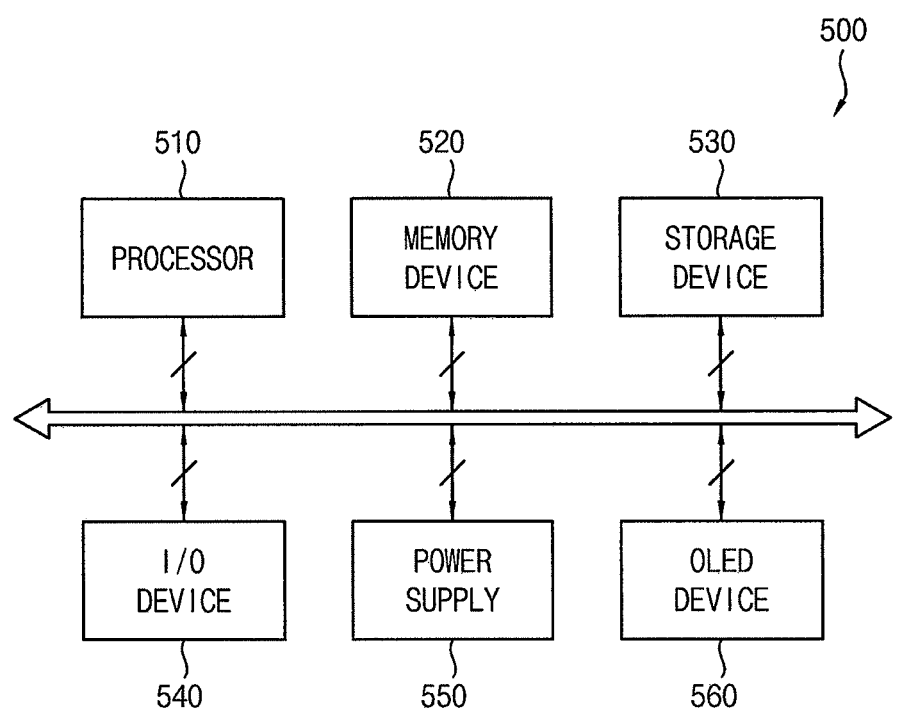
FIG. 10 illustrates a block diagram of an electronic device according to an example embodiment.

FIG. 10 is a block diagram illustrating an electronic device according to an example embodiment.

Referring to FIG. 10, the electronic device 500 may include a processor 510, a memory device 520, a storage device 530, an input/output (I/O) device 540, a power supply 550, and display device such as an organic light emitting display device 560. The organic light emitting display device 560 may be, for example, the organic light emitting display device 300 of FIG. 9. In addition, the electronic device 500 may include a plurality of ports for communicating with a video card, a sound card, a memory card, a universal serial bus (USB) device, other electronic devices, etc. For example, the electronic device 500 may be implemented as a smart phone, a cellular phone, a video phone, a smart pad, a smart watch, a tablet PC, a car navigation system, a computer monitor, a laptop, a digital camera, etc.

The processor 510 may perform various computing functions. The processor 510 may be a microprocessor, a central processing unit (CPU), an application processor (AP), etc. The processor 510 may be coupled to other components via an address bus, a control bus, a data bus, etc. Further, the processor 510 may be coupled to an extended bus such as a peripheral component interconnection (PCI) bus. The memory device 520 may store data for operations of the electronic device 500. For example, the memory device 520 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc., and/or at least one volatile memory device such as a dynamic random access memory (DRAM) device, a static random access memory (SRAM) device, a mobile DRAM device, etc. The storage device 530 may include a solid state drive (SSD) device, a hard disk drive (HDD) device, a CD-ROM device, etc. The I/O device 540 may include an input device such as a keyboard, a keypad, a mouse device, a touchpad, a touch-screen, etc., and an output device such as a printer, a speaker, etc. In an example embodiment, the organic light emitting display device 560 may be included in the I/O device 540. The power supply 550 may provide power for operations of the electronic device 500.

The organic light emitting display device 560 may be coupled to other components via the buses or other communication links. The organic light emitting display device 560 may early detect defects due to wiring-disconnection of a low-power voltage wiring that extends along a periphery of a display panel. For this operation, the organic light emitting display device 560 may include the display panel, a display panel driving circuit, and a wiring-disconnection detecting circuit. The display panel may have a structure in which a low-power voltage is commonly applied to a plurality of pixels through a cathode layer that is connected to the low-power voltage wiring by a bridge pattern when the low-power voltage is applied to the low-power voltage wiring. The display panel driving circuit may drive the display panel. The wiring-disconnection detecting circuit may supply a test voltage to the low-power voltage wiring, may receive a feedback voltage corresponding to the test voltage through a monitoring wiring that is connected to one point of the low-power voltage wiring, and may detect whether the low-power voltage wiring is disconnected based on an RC delay of the feedback voltage in a wiring-disconnection detecting mode of the display panel. In an example embodiment, the wiring-disconnection detecting circuit may include a low-power voltage supply, a monitoring wiring, and a wiring-disconnection determiner. The low-power voltage supply may supply the low-power voltage to the low-power voltage wiring in a normal operating mode of the display panel and may supply the test voltage to the low-power voltage wiring in the wiring-disconnection detecting mode. The monitoring wiring may include a first end that is connected to the point of the low-power voltage wiring and a second end at which the feedback voltage is output in the wiring-disconnection detecting mode of the display panel. The wiring-disconnection determiner may receive the feedback voltage from the second end of the monitoring wiring, may measure the RC delay of the feedback voltage, and may determine that the low-power voltage wiring is disconnected when the RC delay of the feedback voltage is larger than a predetermined reference value. Thus, the wiring-disconnection detecting circuit may accurately detect whether the low-power voltage wiring, which extends along the periphery of the display panel, is disconnected in a simple way. The wiring-disconnection detecting circuit is described above.

Example embodiments may be applied to an organic light emitting display device and an electronic device including the organic light emitting display device. For example, example embodiments may be applied to a cellular phone, a smart phone, a video phone, a smart pad, a smart watch, a tablet PC, a car navigation system, a computer monitor, a laptop, a digital camera, etc.

As described above, embodiments relate to a wiring-disconnection detecting circuit for detecting whether a low-power voltage wiring (e.g., a wiring through which a low-power voltage ELVSS is transferred), which extends along a periphery of a display panel, is disconnected, and a display device such as an organic light emitting display device including the wiring-disconnection detecting circuit. Embodiments may provide a wiring-disconnection detecting circuit that can effectively detect whether a low-power voltage wiring, which extends along a periphery of a display panel, is disconnected. Embodiments may provide an organic light emitting display device including the wiring-disconnection detecting circuit.

A wiring-disconnection detecting circuit according to an example embodiment may accurately detect whether a low-power voltage wiring, which extends along a periphery of a display panel, is disconnected in a simple way by supplying a test voltage to the low-power voltage wiring, by receiving a feedback voltage corresponding to the test voltage through a monitoring wiring that is connected to one point of the low-power voltage wiring, by measuring an RC delay of the feedback voltage, and by determining that the low-power voltage wiring is disconnected when the RC delay of the feedback voltage is larger than a predetermined reference value in a wiring-disconnection detecting mode of the display panel.

In addition, an organic light emitting display device including the wiring-disconnection detecting circuit according to an example embodiment may provide early detection of defects (e.g., degradation in display quality, etc.) due to wiring-disconnection of a low-power voltage wiring that extends along a periphery of a display panel.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A wiring-disconnection detecting circuit, comprising:
 a low-power voltage supply to supply a low-power voltage to a low-power voltage wiring that extends along a periphery of a display panel in a normal operating mode of the display panel, and to supply a test voltage to the low-power voltage wiring in a wiring-disconnection detecting mode of the display panel;
 a monitoring wiring including a first end that is electrically connected to one point of the low-power voltage wiring and a second end at which a feedback voltage corresponding to the test voltage is output in the wiring-disconnection detecting mode; and
 a wiring-disconnection determiner to receive the feedback voltage from the second end, to measure an RC delay of the feedback voltage, and to determine that the low-power voltage wiring is disconnected when the RC delay is larger than a predetermined reference value,
 wherein the low-power voltage is a constant voltage, and the test voltage is a clock pulse voltage.

2. The wiring-disconnection detecting circuit as claimed in claim 1, wherein the RC delay is measured based on a rising time of the feedback voltage corresponding to the test voltage.

3. The wiring-disconnection detecting circuit as claimed in claim 2, wherein the wiring-disconnection determiner determines that the low-power voltage wiring is disconnected when the rising time of the feedback voltage is larger than a predetermined reference time.

4. The wiring-disconnection detecting circuit as claimed in claim 1, wherein the low-power voltage wiring includes third and fourth ends that are connected to the low-power voltage supply, and the low-power voltage and the test voltage are applied to the low-power voltage wiring through the third and fourth ends.

5. The wiring-disconnection detecting circuit as claimed in claim 4, wherein the low-power voltage supply is implemented in a display panel driving circuit that drives the display panel, and the low-power voltage wiring extends via a pad region at which the display panel and the display panel driving circuit are connected.

6. The wiring-disconnection detecting circuit as claimed in claim 4, wherein the low-power voltage supply includes:
    a first voltage generating block connected to the third and fourth ends of the low-power voltage wiring and to generate the low-power voltage;
    a second voltage generating block to generate the test voltage; and
    a switch connected between the second voltage generating block and the third and fourth ends of the low-power voltage wiring, the switch to be turned off in the normal operating mode and to be turned on in the wiring-disconnection detecting mode.

7. The wiring-disconnection detecting circuit as claimed in claim 6, wherein the second voltage generating block is a DC-AC inverter.

8. The wiring-disconnection detecting circuit as claimed in claim 4, wherein the low-power voltage supply includes:
    a first voltage generating block to generate the low-power voltage;
    a second voltage generating block to generate the test voltage;
    a first switch connected between the first voltage generating block and the third and fourth ends of the low-power voltage wiring, the first switch to be turned on in the normal operating mode and to be turned off in the wiring-disconnection detecting mode; and
    a second switch connected between the second voltage generating block and the third and fourth ends of the low-power voltage wiring, the second switch to be turned off in the normal operating mode and to be turned on in the wiring-disconnection detecting mode.

9. The wiring-disconnection detecting circuit as claimed in claim 8, wherein the second voltage generating block is a DC-AC inverter.

10. An organic light emitting display device, comprising:
    a display panel in which a low-power voltage wiring extends along a periphery of the display panel;
    a cathode layer that is electrically connected to the low-power voltage wiring via a bridge pattern such that, when a low-power voltage is applied to the low-power voltage wiring, the low-power voltage is commonly applied to a plurality of pixels;
    a display panel driving circuit to drive the display panel; and
    a wiring-disconnection detecting circuit to supply a test voltage to the low-power voltage wiring, to receive a feedback voltage corresponding to the test voltage through a monitoring wiring that is electrically connected to one point of the low-power voltage wiring, and to detect whether the low-power voltage wiring is disconnected based on an RC delay of the feedback voltage in a wiring-disconnection detecting mode of the display panel,
    wherein the low-power voltage is a constant voltage, and the test voltage is a clock pulse voltage.

11. The organic light emitting display device as claimed in claim 10, wherein the wiring-disconnection detecting circuit includes:
    a low-power voltage supply to supply the low-power voltage to the low-power voltage wiring in a normal operating mode of the display panel, and to supply the test voltage to the low-power voltage wiring in the wiring-disconnection detecting mode;
    a monitoring wiring including a first end that is connected to the point of the low-power voltage wiring and a second end at which the feedback voltage is output in the wiring-disconnection detecting mode; and
    a wiring-disconnection determiner to receive the feedback voltage from the second end, to measure the RC delay, and to determine that the low-power voltage wiring is disconnected when the RC delay is larger than a predetermined reference value.

12. The organic light emitting display device as claimed in claim 11, wherein the RC delay is measured based on a rising time of the feedback voltage corresponding to the test voltage.

13. The organic light emitting display device as claimed in claim 12, wherein the wiring-disconnection determiner determines that the low-power voltage wiring is disconnected when the rising time of the feedback voltage is larger than a predetermined reference time.

14. The organic light emitting display device as claimed in claim 11, wherein
    the low-power voltage wiring includes third and fourth ends that are connected to the low-power voltage supply, and
    the low-power voltage and the test voltage are applied to the low-power voltage wiring through the third and fourth ends.

15. The organic light emitting display device as claimed in claim 14, wherein the low-power voltage supply is implemented in the display panel driving circuit, and the low-power voltage wiring extends via a pad region at which the display panel and the display panel driving circuit are connected.

16. The organic light emitting display device as claimed in claim 15, wherein the low-power voltage supply includes:
    a first voltage generating block connected to the third and fourth ends of the low-power voltage wiring and to generate the low-power voltage;
    a second voltage generating block to generate the test voltage; and
    a switch connected between the second voltage generating block and the third and fourth ends of the low-power voltage wiring, the switch to be turned off in the normal operating mode and to be turned on in the wiring-disconnection detecting mode.

17. The organic light emitting display device as claimed in claim 15, wherein the low-power voltage supply includes:
    a first voltage generating block to generate the low-power voltage;
    a second voltage generating block to generate the test voltage;
    a first switch connected between the first voltage generating block and the third and fourth ends of the low-power voltage wiring, the first switch to be turned on in the normal operating mode and to be turned off in the wiring-disconnection detecting mode; and
    a second switch connected between the second voltage generating block and the third and fourth ends of the low-power voltage wiring, the second switch to be turned off in the normal operating mode and to be turned on in the wiring-disconnection detecting mode.

18. The organic light emitting display device as claimed in claim 14, wherein the wiring-disconnection determiner is implemented in the display panel driving circuit.

\* \* \* \* \*